United States Patent
Bollenbeck et al.

(10) Patent No.: US 10,222,443 B2
(45) Date of Patent: Mar. 5, 2019

(54) GENERATING MOTION INFORMATION FOR AN AT LEAST PARTIALLY MOVING EXAMINATION REGION

(71) Applicants: Jan Bollenbeck, Eggolsheim (DE); Georg Pirkl, Dormitz (DE); Robert Rehner, Neunkirchen am Brand (DE); Peter Speier, Erlangen (DE); Markus Vester, Nürnberg (DE)

(72) Inventors: Jan Bollenbeck, Eggolsheim (DE); Georg Pirkl, Dormitz (DE); Robert Rehner, Neunkirchen am Brand (DE); Peter Speier, Erlangen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 409 days.

(21) Appl. No.: 15/052,607

(22) Filed: Feb. 24, 2016

(65) Prior Publication Data

US 2016/0245888 A1 Aug. 25, 2016

(30) Foreign Application Priority Data

Feb. 25, 2015 (DE) .................. 10 2015 203 385

(51) Int. Cl.
*G01V 3/00* (2006.01)
*G01R 33/563* (2006.01)
*G01R 33/565* (2006.01)

(52) U.S. Cl.
CPC .. *G01R 33/56308* (2013.01); *G01R 33/56509* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

| | | | | |
|---|---|---|---|---|
| 4,712,560 A | * | 12/1987 | Schaefer | ............ G01R 33/5676 324/309 |
| 2006/0235289 A1 | | 10/2006 | Wesselink et al. | |
| 2009/0012387 A1 | | 1/2009 | Hanson et al. | |
| 2009/0118742 A1 | * | 5/2009 | Hartmann | .......... A61B 17/1703 606/130 |

(Continued)

FOREIGN PATENT DOCUMENTS

| | | |
|---|---|---|
| CN | 104248438 A | 12/2014 |
| DE | 102013205576 A1 | 10/2014 |

OTHER PUBLICATIONS

German Grant Decision for German Application No. 10 2015 203 385.6, Grant decision dated Aug. 9, 2017, with English Translation.

(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method for generating motion information for an at least partially moving examination region includes outputting at least one first excitation signal with a first frequency band. The first excitation signal is picked up with a receive coil arrangement of a magnetic resonance system. The at least one coil of the receive coil arrangement is configured to pick up a receive frequency band that includes the first frequency band. At least one item of motion information for the examination region is determined from the picked up first excitation signal.

15 Claims, 4 Drawing Sheets

(58) Field of Classification Search
USPC ........................................................ 324/309
See application file for complete search history.

(56) References Cited

U.S. PATENT DOCUMENTS

2013/0278263 A1* 10/2013 Huang ............... G01R 33/5611
324/309
2014/0296698 A1 10/2014 Bauer et al.

OTHER PUBLICATIONS

German Office Action for German Application No. 10 2015 203 385.6 dated Apr. 13, 2017, with English Translation.
German office Action for related German Application No. 10 2015 203 385.6 dated May 25, 2016, with English Translation.
Lars G. Hanson et al., "Encoding of Electrophysiology and Other Signals in MR Images", Journal of Magnetic Resonance Imaging 25, 2007, pp. 1059-1066, 2007.
Odille Freddy et al; "Generalized MRI Reconstruction Including Elastic Physiological Motion and Coil Sensitivity Encoding"; Magnetic Resonance in Medicine; vol. 59; pp. 1401-1411, 2008.
Anna Andreychenko et al., "Noise variance of an RF receive array reflects respiratory motion: a novel respiratory motion predictor", Proc. Intl. Soc. Mag. Reson. Med. 22, p. 0092, 2014.
Buikman, D. et al: "The RF Coil As a Sensitive Motion Detector for Magnetic Resonance Imaging", Magnetic Resonance Imaging, vol. 6, pp. 281-289, 1988.

* cited by examiner

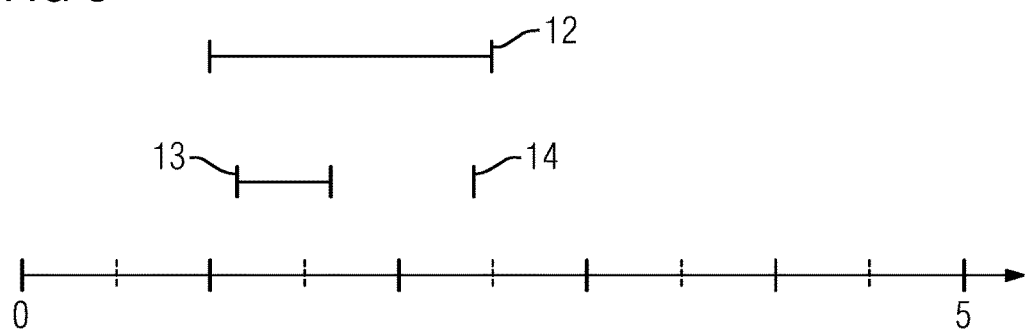
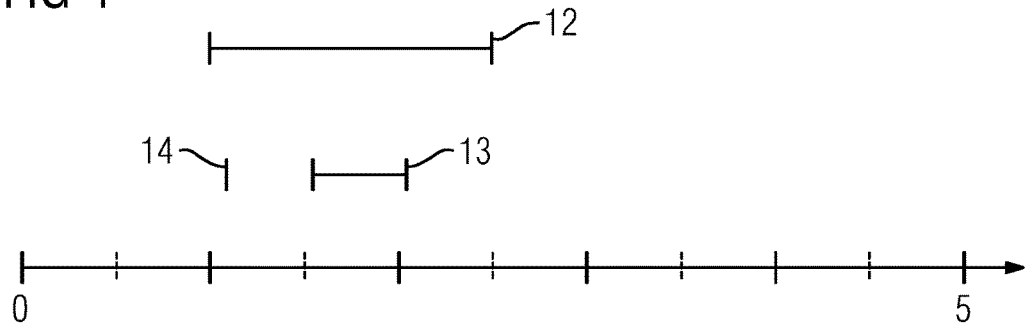

GENERATING MOTION INFORMATION FOR AN AT LEAST PARTIALLY MOVING EXAMINATION REGION

This application claims the benefit of DE 10 2015 203 385.6, filed on Feb. 25, 2015, which is hereby incorporated by reference in its entirety.

BACKGROUND

The present embodiments relate to generating motion information for an at least partially moving examination region.

When gradients are used for spatial encoding when acquiring magnetic resonance data sets, the signals picked up are affected by motion. This is true for both simple imaging and spectroscopic data sets with spatial resolution.

Motion artifacts may be produced in subjects by cardiac motion and also by respiratory motion. In order to avoid artifacts due to motion of the heart, it is known to evaluate an ECG signal of the subject or patient and trigger the data acquisition as a function of the ECG signal. This provides that the data sets are acquired in the same phase of the cardiac cycle.

A number of methods for determining respiratory motion are known. The motion of the abdomen may be determined by a measuring belt. This does not influence MR measurements but only supplies approximate information about the deformation of the abdomen in the examination region.

It is therefore also known to pick up navigator echoes. One or more 2D slices or 3D volumes with predetermined orientations are read, and the differences allow translations and rotations of the region in question to be inferred in otherwise identical acquisition conditions. This method allows motions to be detected very precisely, but such measurements also cause the signal to become saturated in the image region of an image. Also, the navigator measurements are to be acquired in measurement pauses of a measurement sequence. The navigator measurements therefore may not be used with steady state sequences such as FLASH or TrueFISP.

It is set out in Andreychenko et al., Noise variance of an RF receive array reflects respiratory motion: a novel respiratory motion predictor, Proc. Intl. Soc. Mag. Reson. Med., 22, page 92, 2014 how to pick up noise signal with a coil of a magnetic resonance system. The amplitude of this varies with the motion of the abdomen. The noise signal may also only be picked up in measurement pauses, and approximately 40,000 averages are used to obtain a usable SNR. The measurement then takes 40 ms even for samples with a duration of only 1 µs. This provides that the method may only be combined with steady state sequences in exceptional instances.

However, motion artifacts also result when other imaging modalities such as SPECT or PET, which average signals during different motion phases of the respiratory cycle, are used.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method for generating motion information, with which respiratory motion or respiratory position may be determined or corrected and which may be combined with steady state sequences for magnetic resonance acquisitions, is provided.

A method for generating motion information for an at least partially moving examination region includes outputting at least one first excitation signal with a first frequency band. The first excitation signal is picked up with a receive coil arrangement (e.g., with a receive coil arrangement of a magnetic resonance system). The at least one coil of the receive coil arrangement is configured to pick up a receive frequency band that includes the first frequency band. At least one item of motion information for the examination region is determined from the picked up first excitation signal.

A receive coil arrangement is used to pick up a signal that is a function of the motion of an examination region (e.g., the abdomen). The signal (e.g., a first excitation signal) is not a resonance signal in contrast to standard MR measurements. Differences relating to the receiving of the first excitation signal result from motion of the examination object, which brings about a change in the transmission properties of the signal path between the transmitter of the first excitation signal and the receive coil arrangement. Motion may produce a change in the quality of the coil(s) of the receive coil arrangement and may also change the orientation of the receive coil arrangement. Even if the first excitation signal possibly passes through the examination object, differences in the signal path may result as a function of the motion. Inferences may be drawn from these differences with regard to the respiratory or motion phase (e.g., full inhalation). The use of an excitation signal also provides that no averages are required. The motion information may be used, for example, for motion correction of a measurement signal.

The term excitation signal may refer to direct or indirect signal generation in the receive coil arrangement and not to an interaction with the nuclear spin of the examination object, which is, however, not excluded, as with the second excitation signal. There is a direct interaction here with the first excitation signal in that no resonance signal is generated due to an interaction with nuclear spin. The excitation signal therefore does not simply excite nuclear spin; the excitation signal may include any type of excitation.

As no resonance signal is used, the method may also be used in hybrid imaging modalities and in measurement pauses of the magnetic resonance system there. The motion information then serves, for example, for the motion correction of a PET or SPECT image data set. However, the method may also be used for simple MR measurements.

In contrast to motion detection by MR navigators with the method of one or more of the present embodiments, deployment is possible with steady state sequences, and very few, if any, averages are required.

Fundamentally, the method may even be performed without a magnetic resonance system, as the first excitation signal is not a resonance signal. However, the receive coil arrangement is present in a magnetic resonance system or a corresponding hybrid imaging modality anyway, so this deployment site may be provided. Reference is therefore made in the following to magnetic resonance systems without limiting the field of deployment thereto.

A second excitation signal with a second frequency band may therefore be output. The resonance signal generated by the second excitation signal has a third frequency band that is independent of the second frequency band. The third frequency band is at least essentially outside the first frequency band. The second excitation signal may therefore be a high-frequency impulse for generating magnetic resonance signals. The receive coil arrangement is therefore configured to pick up a receive frequency band, which includes at least the first frequency band and the third frequency band.

During the acquisition of a magnetic resonance image data set, the first excitation signal is therefore close to the signal originating from the examination object. The first frequency band therefore does not clash with the actual measurement signal, the resonance signal, which is in the third frequency band.

The first frequency band and the third frequency band may not overlap at all, but it is possible for the frequency bands to overlap in the edge regions. During imaging experiments, the first frequency band may therefore be at frequencies, in which no part of the examination object is located. It may therefore be at the edge of the frequency band that may be picked up with the receive coil arrangement.

The first frequency band and the third frequency band may, however, overlap in principle, as no signal is generally read during the application of the second excitation signal.

If two first excitation signals are used, the first excitation signals may each be at one of the two edges of the frequency band that may be picked up with the receive coil arrangement.

The first frequency band may be as narrow as desired, as the first frequency band always covers a specific frequency range, even if the first frequency band is only several mHz wide. This is also referred to as the frequency band in the present application. The first excitation signal may therefore also be a single-frequency signal.

The following should be noted with regard to the coil arrangement. It is sufficient for a single coil to be used as the transmit and receive coil. However, it is usual with magnetic resonance devices with tunnels for patients for a body coil to be used as the excitation coil and for a separate receive coil arrangement (e.g., configured as a coil array) to be used. The above configuration may be provided, as the configuration allows a homogeneous excitation profile and a high SNR to be achieved at the same time with short measurement times. The at least one coil of the receive coil arrangement is to be configured to pick up a receive frequency band that includes the first frequency band and, when the described method is used for MR measurements, the third frequency band. The overall signal then picked up with the receive coil arrangement is made up of the resonance signal and the second excitation signal.

The excitation signals are distinguished using the adjectives "first" and "second", but this does not provide that the first excitation signal is output before the second excitation signal in time. Simultaneous outputting or outputting of the second excitation signal before the first excitation signal may be provided.

The second excitation signal may be output in the form of an HF impulse. The acquisition of a conventional magnetic resonance data set without the features relating to the first excitation signal may be provided. The resonance signal of the second excitation signal is then either an FID or an echo signal. An evolution phase lies between the second excitation signal and the reading of the resonance signal.

The second frequency band may be selected such that protons are excited with the second excitation signal. The method may also be performed with other nuclei such as carbon nuclei or other magnet resonant nuclei. However, the signal intensity is weaker for other nuclei, which is also why the first excitation signal should not be much stronger than the resonance signal; otherwise, the receive path may be overshot. Averages may then be required; these may be avoided.

The first excitation signal, if overlaid with the resonance signal, may be extracted from the signal measured with the coil arrangement before disruptive post processing steps such as off center correction and downsampling take place.

A steady state sequence may be used to acquire a magnetic resonance data set. This has a higher SNR efficiency than other sequences.

The motion information may be determined from a signal intensity (e.g., at least one amplitude) of the first excitation signal. The motion of the examination region causes the charge of the receive coil arrangement, for example, to vary. This is why a motion phase is inferred from the signal strength of a received signal, the setpoint value of which is known, over the actual value. The term phase relates here to a pseudo or approximately periodic motion. A phase is an arbitrary and more or less short segment of the periodic motion. One example is the motion of the examination region due to respiratory motion. The classification and number of the phases is in principle arbitrary. The motion information may be used for motion correction.

The first excitation signal and the second excitation signal may be output with at least one coil arrangement of a magnetic resonance system. The coil arrangement may, for example, be at least partially detuned to output the second excitation signal compared with the outputting of the first excitation signal. The second excitation signal is always output with a coil arrangement (e.g., with a body coil).

A coil array may be used as the coil arrangement.

With some magnetic resonance devices, the transmit path and the receive path or chain consist essentially of the same components, and a switch takes place between transmit and receive at at least one point in order to switch from a high-frequency generator to a receive unit. It is therefore not possible to transmit and receive simultaneously. The first excitation signal then is to be stored and output with a time delay (e.g., using the body coil).

Alternatively, the second excitation signal may be output with a coil arrangement of the magnetic resonance system, and the first excitation signal may be output with a transmit unit external to the magnetic resonance system. The transmit units therefore output HF signals. The coil arrangement is a standard part of a magnetic resonance system, and the external transmit unit is an auxiliary device. The auxiliary device may be protected from injection of the HF impulses of the magnetic resonance device. In one embodiment, the transmit frequency of the first excitation signal and/or the amplitude of the first excitation signal may be transferred to the auxiliary device. This may be done by the control facility of the magnetic resonance system.

A continuous wave signal may be output as the first excitation signal. As there is no or essentially no interaction in the form of excitation of the nuclear spin with the examination object, the first excitation signal may be output continuously. This provides that differences in the first excitation signal received in the receive coil only occur due to a different charge and not due to differences such as time delays in the transmission of the first excitation signal.

The outputting of the excitation signals and the picking up of the resonance signal and the first excitation signal may be performed repeatedly to acquire an image data set. It is known that a plurality of k space lines are to be acquired to generate a magnetic resonance image. At least a first excitation signal is acquired with each FID or echo signal. A number of first excitation signals or just one first excitation signal may be acquired for an FID or echo. An FID is acquired, for example, for CSI images (e.g., spectroscopic image data sets with spatial resolution). With a number of first excitation signals, a time series of first excitation signals, for example, used to determine the motion phase of the examination region with less ambiguity at the acquisition time of the FID or echo may be obtained.

This also applies for other measuring methods such as PET and SPECT. More generally, one or more first excitation signals may be picked up for a measurement event such as the acquisition of the resonance signal. The time profile of the first excitation signal may also be captured over longer time periods or for a number of measurement points. This may also be done simultaneously for a number of (e.g., two) first excitation signals. A measurement event may then also be a PET or SPECT measurement event.

Alternatively, the outputting of the excitation signals and the picking up of the resonance signal and the first excitation signal may be performed repeatedly to acquire a data set to generate a spectrum. A raw data set is acquired. A one-dimensional or multidimensional Fourier transform is provided to use this to obtain a spectrum or image. Other post-processing steps such as baseline correction or zero filling may also be used both with imaging and spectroscopic data sets.

In one embodiment, the center frequency of the first frequency band and the center frequency of the third frequency band may be more than 0.5 MHz and less than 1.5 MHz apart. This distance provides that existing hardware may be used and the best possible separation of the frequency bands may be achieved.

A bandwidth of the first frequency band smaller than 0.5 MHz may be used. The first frequency band may only act on a strip one to two pixels or voxels wide. The bandwidth of the first frequency band may be selected accordingly. The first excitation signal may also be single-frequency.

Additionally or alternatively, the width and position of the first frequency band may be determined as a function of the frequency resolution of a magnetic resonance image to be generated from the resonance signal. This may be given in Hz/pixel. The width of the frequency band of the first excitation signal may then be determined via this predetermination and the number of pixels to be covered by the first excitation signal.

A bandwidth of the third frequency band of 0.5 MHz to 1 MHz may be used. The bandwidth of the third frequency band together with the number of image points or pixels determines the resolution of an examination object in the read direction. Oversampling uses a larger bandwidth than an acquisition without oversampling. The bandwidth of the third frequency band is determined by the gradient strength of the read gradient.

A predetermined signal shape may be used as the signal shape of the first excitation signal. The signal shape may be periodic, so that it is possible to infer the charge of the coils and therefore the motion phase of the motion of the moving examination region, for example, from the signal component of the first excitation signal extracted from the overall signal.

The outputting of the second excitation signal may be triggered as a function of an evaluation of the received first excitation signal. As mentioned, a number of times above the motion phase is inferred from the received first excitation signal. This information may be used to trigger the measurement or the outputting of the second excitation signal. The receive coil arrangement may, for example, receive signals continuously until the second excitation signal is output.

The first excitation signal and the second excitation signal may be output with a time offset. As soon as the time point for outputting the first excitation signal has been determined, no more motion information has to be collected before the acquisition of the resonance signal, as is possible with periodic motion such as respiratory motion.

In one or more of the present embodiments, a magnetic resonance system is provided. This includes at least one control facility (e.g., a controller). The magnetic resonance system is characterized in that the controller is configured to perform the method as described.

In one or more of the present embodiments, a hybrid imaging modality including a magnetic resonance system and a second imaging modality is provided. The hybrid imaging modality is characterized in that the magnetic resonance system is configured as described. The control facility may also control the second imaging modality at the same time.

The second imaging modality may, for example, be a PET facility or a SPECT facility.

The implementation of the abovementioned methods in the control apparatus may be effected as, for example, software or as hardware (e.g., permanently wired hardware).

Further advantageous embodiments of the magnetic resonance system and/or hybrid imaging modality correspond to corresponding embodiments of the method. The corresponding method features and advantages are therefore not set out here to avoid unnecessary repetition.

BRIEF DESCRIPTION OF THE DRAWINGS

FIG. 3 shows a frequency band in a first embodiment;
FIG. 4 shows a frequency band in a second embodiment.

DETAILED DESCRIPTION

Figure 1:
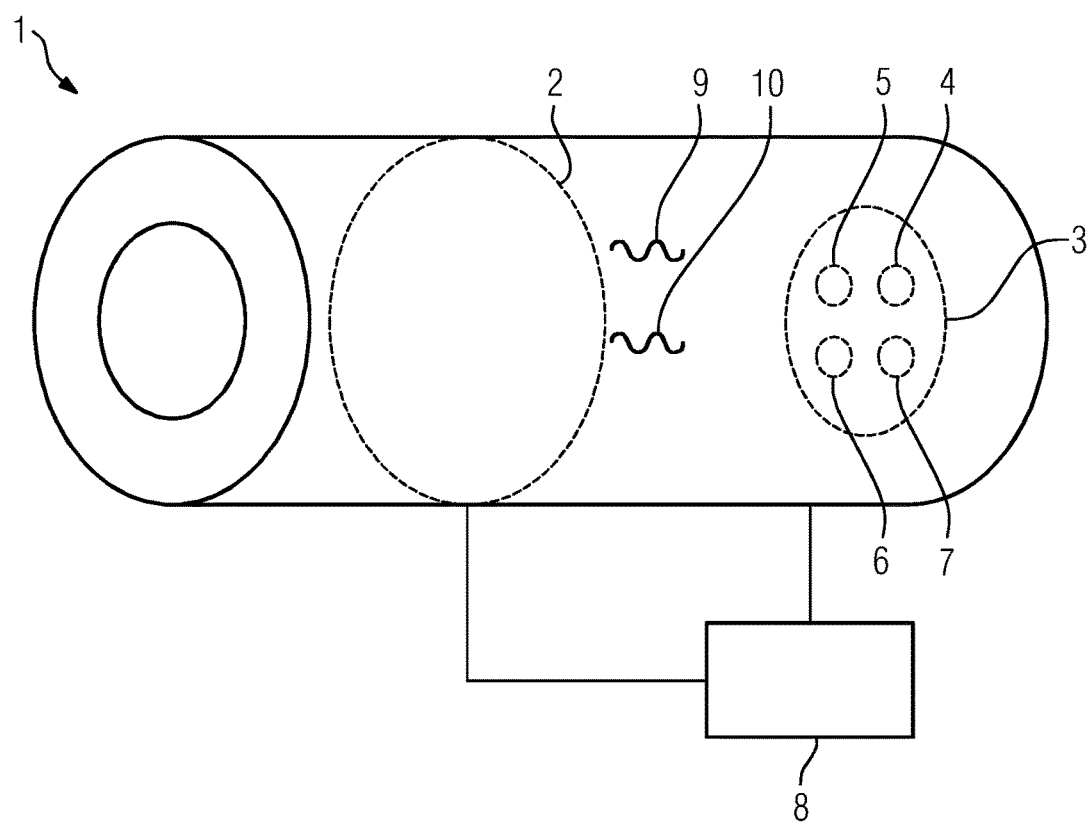
FIG. 1 shows a magnetic resonance system in a first embodiment.

FIG. 1 shows a magnetic resonance system 1. The magnetic resonance system 1 includes a high-frequency coil 2 configured as a body coil and a receive coil arrangement in the form of a coil array 3 with coils 4, 5, 6 and 7 and a control facility 8 (e.g., a controller). A body coil such as the coil 2 is used to stimulate magnetization by outputting an excitation signal 9 (e.g., a second excitation signal) in the form of a high-frequency impulse at the resonant frequency of protons. The second excitation signal 9 is output with a bandwidth of 0.5 MHz to 1.0 MHz. The center frequency is, for example, a function of the resonant frequency of the nuclei to be excited and the magnetic field strength of the magnetic resonance system 1. With protons and a magnetic field strength of 1.5 T, the resonant frequency and therefore the center frequency of the first excitation signal 9 is 63.9 MHz. The coil array 3, however, is provided to read the measurement signal. The coils 4, 5, 6 and 7 of the coil array 3 read the measurement signal simultaneously. An individual coil may also be used as the detection coil instead of a coil array 3.

The coil 2 may also be used to output the first excitation signal 10, being detuned to output the first excitation signal, so that the first and second frequency bands are at a distance from one another.

Figure 2:
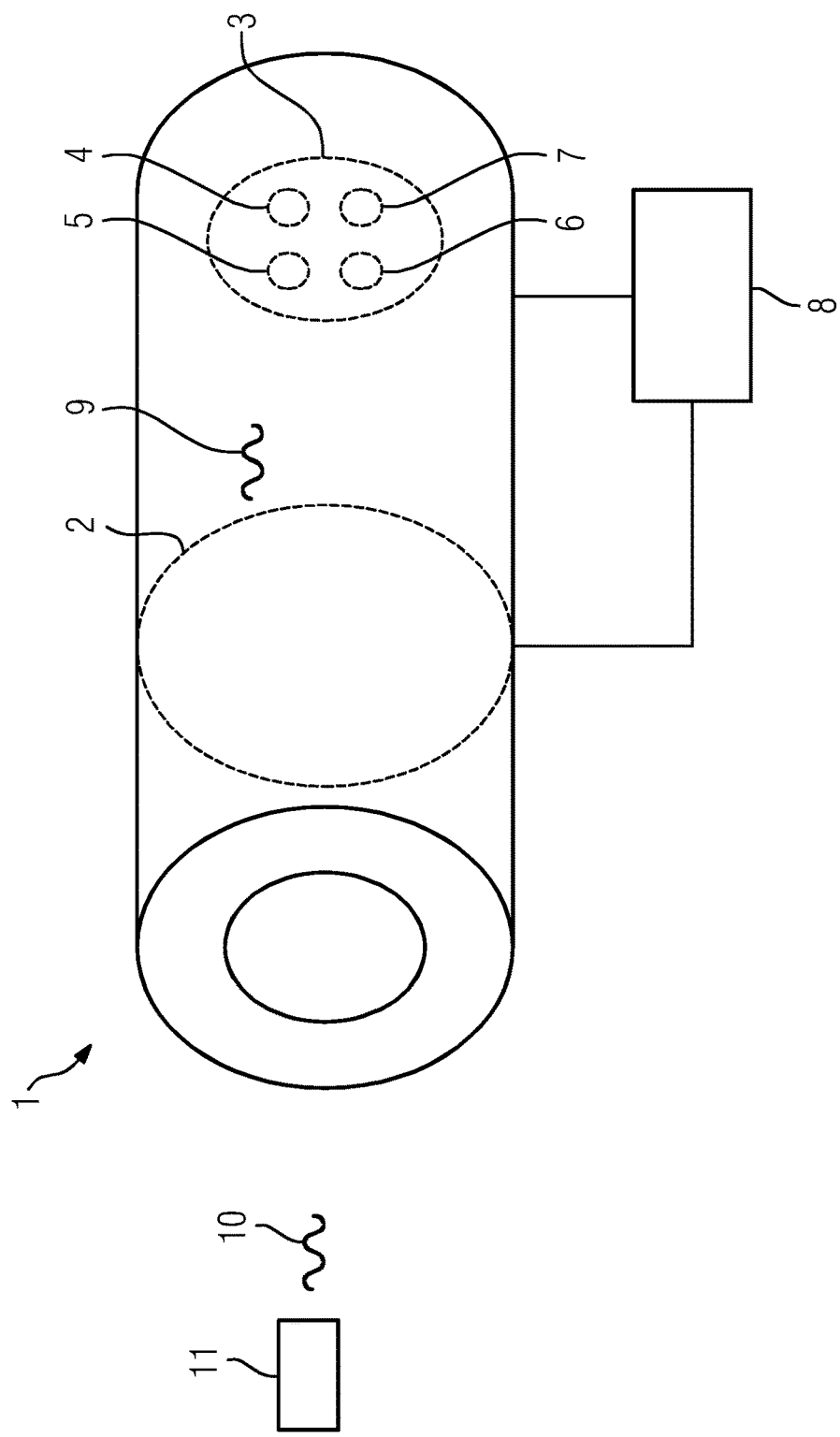
FIG. 2 shows a magnetic resonance system in a second embodiment.

FIG. 2 shows an alternative embodiment for outputting a first excitation signal 10. The first excitation signal 10 is output by, for example, an external transmit unit 11. The first excitation signal 10 may then be output as a continuous wave signal, as the external transmit unit 11 is not affected by the switching of the coils 2 to 7 of the magnetic resonance system 1 from transmit to receive chain.

Regardless of the embodiment of the unit for outputting the first excitation signal 10, the first excitation signal 10 is detected by the receive coil arrangement 3 of the magnetic resonance system. The first excitation signal 10 is digitized with 10 MHz, at a bandwidth of 2.5 MHz (e.g., together with the resonance signal). The resonance signal of the second excitation signal 9 may, for example, impose between 0.5 MHz and 1 MHz, and the first excitation signal may impose up to 0.5 MHz.

This is independent of the absolute position of the respective center frequencies. For protons, this is 63.9 MHz for the second excitation signal 9 and also the resonance signal, but in the receive chain, the absolute position of the center frequency is mixed down to a value of several MHz. The center frequency of the first excitation signal 10 is and remains at a corresponding distance. These relative positions are shown in greater detail in the following for B0 field strengths of 1.5 T and 3 T:

FIG. 3 shows the frequency band before the digitizer. FIG. 3 shows a frequency band of 0 MHz to 5 MHz, the receive band 12 of the receive coil arrangement 3 is, for example, 1.5 MHz wide, and the center is at 1.75 MHz. The third frequency band 13 is 0.5 MHz with a center frequency of the resonance signal at 1.4 MHz. This also corresponds to the FoV.

The first frequency band 14 of the first excitation signal 10 is at 2.4 MHz and therefore at the edge of the receive band 12.

FIG. 4 shows the frequency band before the digitizer in a 3 T magnetic resonance system. The receive band 12 of the receive coil arrangement is again 1.5 MHz wide, and the center is again at 1.75 MHz. The third frequency band 13 is also 0.5 MHz wide. However, the center frequency is at 1.8 MHz. The first frequency band 14 of the first excitation signal 10 at 1.6 MHz is therefore positioned at the other edge of the receive band 12.

A distance between the center frequencies of the frequency bands 13 and 14, corresponding to double the width of the third frequency band 13 (e.g., 1 MHz in the example), may be maintained in each instance.

Figure 5:
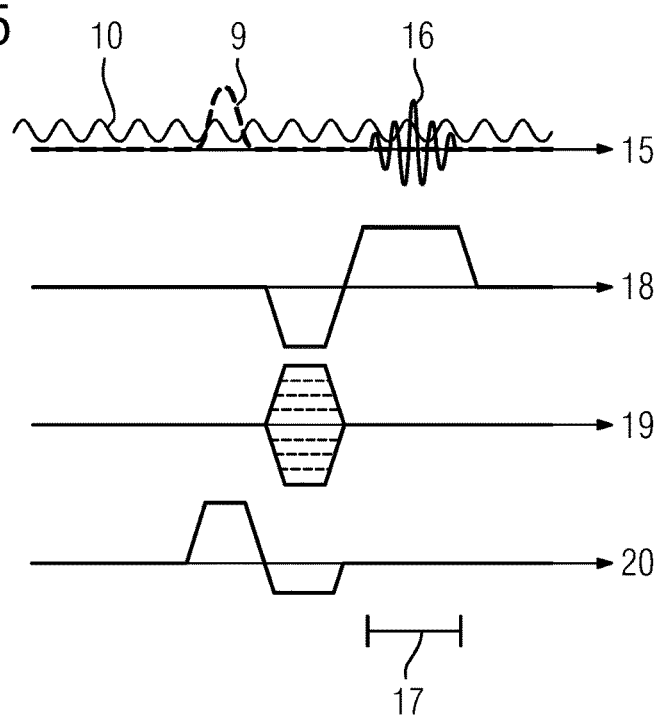
FIG. 5 shows an exemplary measurement sequence.

FIG. 5 shows a sequence for generating a magnetic resonance image. This is what is referred to as a FLASH and therefore a typical steady-state sequence. Shown against the axis 15 are the second excitation signal 9 in the form of an HF impulse, the first excitation signal 10, and the resonance signal 16. The overall signal consisting of the signals 10 and 16 is picked up during the acquisition time 17. The overall signal is not shown specifically.

The read gradient is shown against the axis 18, the phase gradient is shown against the axis 19, and the slice gradient is shown against the axis 20. Details of the switching of the gradients are not set out, these being sufficiently well known to the person skilled in the art.

The first excitation signal 10 is a continuous wave signal (e.g., a cw signal), which is why the first excitation signal 10 extends over the full length of the axis 15. Such a first excitation signal 10 may be obtained, for example, with the structure shown in FIG. 2. However, the first excitation signal 10 is only picked up at the acquisition time 17.

Although the transmitted first excitation signal 10 remains identical and is periodic with respect to amplitude, there are differences in the amplitude of the acquired first excitation signal 10 due to the charge of the coils 4, 5, 6 and 7 being changed as a result of motion of the respiratory organs. The respiratory phase may thus be inferred from the amplitude of the picked up first excitation signal 10.

If the respiratory phase is to be traced more closely, further acquisitions of the first excitation signal 10 may also be performed before or after the second excitation signal 9. The first excitation signal 10 does not interact with the examination object but is received directly by the receive coils 4, 5, 6 and 7 or any other receive coil arrangement.

Figure 6:
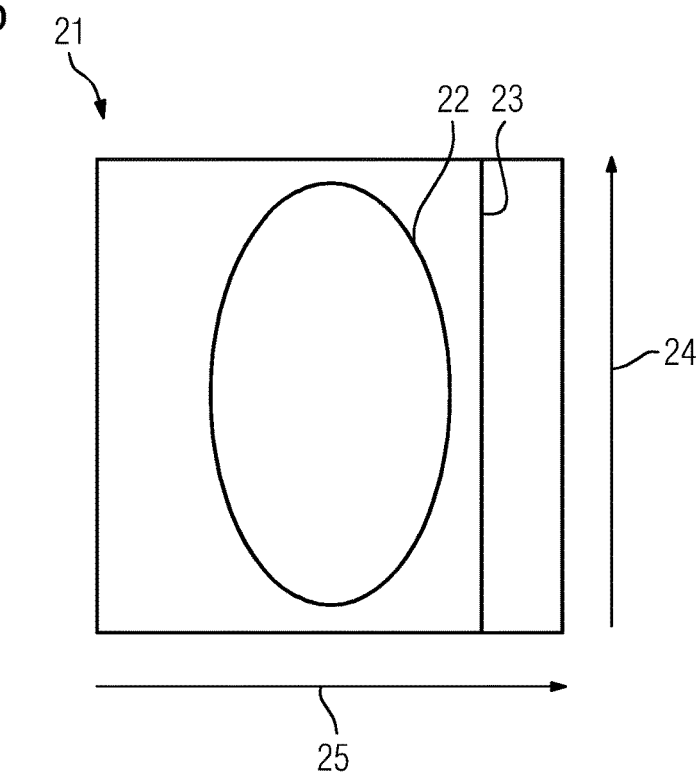
FIG. 6 shows an exemplary magnetic resonance image.

FIG. 6 shows a magnetic resonance image 21 generated from resonance signals 16 and first excitation signals 11. As well as the actual examination object 22, FIG. 6 also shows a strip 23 in the phase direction 24 in a frequency range corresponding to the width of the first frequency band 14. The frequency direction lies, for example, in the direction of the arrow 25.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for generating motion information for an at least partially moving examination region, the method comprising:
    outputting, by a transmit unit that is external to a magnetic resonance system, a first excitation signal with a first frequency band;
    outputting, by a coil arrangement of the magnetic resonance system, a second excitation signal with a second frequency band;
    picking up the first excitation signal with a receive coil arrangement of the magnetic resonance system, wherein at least one coil of the receive coil arrangement is configured to pick up a receive frequency band that includes the first frequency band;
    picking up a resonance signal of the second excitation signal with the receive coil arrangement, wherein the resonance signal has a third frequency band that is at least essentially outside the first frequency band;
    determining an item of motion information for the examination region from the picked up first excitation signal; and
    motion correcting a measurement signal, an image data set, or a part of an image data set using the first excitation signal or a signal derived from the first excitation signal.

2. A magnetic resonance system comprising:
a receive coil arrangement;
a coil arrangement; and
a controller for generating motion information for an at least partially moving examination region, the controller being configured to:
  output, by a transmit unit that is external to the magnetic resonance system, a first excitation signal with a first frequency band;
  output, by the coil arrangement, a second excitation signal with a second frequency band;
  pick up the first excitation signal with the receive coil arrangement, wherein at least one coil of the receive coil arrangement is configured to pick up a receive frequency band that includes the first frequency band;
  pick up a resonance signal of the second excitation signal with the receive coil arrangement, wherein the resonance signal has a third frequency band that is at least essentially outside the first frequency band;
  determine an item of motion information for the examination region from the picked up first excitation signal; and
  motion correct a measurement signal, an image data set, or a part of an image data set using the first excitation signal or a signal derived from the first excitation signal.

3. A hybrid imaging modality comprising:
a first imaging modality, the first imaging modality comprising a magnetic resonance system, the magnetic resonance system comprising:
  a receive coil arrangement;
  a coil arrangement; and
  a controller for generating motion information for an at least partially moving examination region, the controller being configured to:
    output, by a transmit unit that is external to the magnetic resonance system, a first excitation signal with a first frequency band;
    output, by the coil arrangement, a second excitation signal with a second frequency band;
    pick up the first excitation signal with the receive coil arrangement, wherein at least one coil of the receive coil arrangement is configured to pick up a receive frequency band that includes the first frequency band;
    pick up a resonance signal of the second excitation signal with the receive coil arrangement, wherein the resonance signal has a third frequency band that is at least essentially outside the first frequency band;
    determine an item of motion information for the examination region from the picked up first excitation signal; and
    motion correct a measurement signal, an image data set, or a part of an image data set using the first excitation signal or a signal derived from the first excitation signal; and
a second imaging modality.

4. The method of claim 1, wherein the coil arrangement comprises a coil array configured to output the second excitation signal.

5. The method of claim 1, wherein a continuous wave signal is output as the first excitation signal.

6. The method of claim 1, further comprising acquiring a magnetic resonance image data set, the acquiring comprising performing the outputting of the first excitation signal, the outputting of the second excitation signal, the picking up of the resonance signal, and the picking up of the first excitation signal repeatedly.

7. The method of claim 1, further comprising generating a spectrum, generating the spectrum comprising acquiring a data set, acquiring the data set comprising performing the outputting of the first excitation signal, the outputting of the second excitation signal, the picking up of the resonance signal, and the picking up of the first excitation signal repeatedly.

8. The method of claim 1, wherein a center frequency of the first frequency band and a center frequency of the third frequency band are more than 0.5 MHz and less than 1.5 MHz apart.

9. The method of claim 1, wherein a bandwidth of the first frequency band smaller than 0.5 MHz is used.

10. The method of claim 8, wherein a single-frequency signal is used as the first excitation signal.

11. The method of claim 1, wherein a bandwidth of the third frequency band of 0.5 MHz to 1 MHz is used.

12. The method of claim 1, wherein a predetermined signal shape is used as a signal shape of the first excitation signal.

13. The method of claim 1, wherein the outputting of the second excitation signal is triggered as a function of an evaluation of the first excitation signal.

14. The method of claim 1, further comprising determining motion information from a signal intensity of the first excitation signal.

15. The method of claim 1, wherein determining motion information from a signal intensity of the first excitation signal comprises determining the motion information from at least one amplitude of the first excitation signal.

* * * * *